(12) United States Patent
Iotov et al.

(10) Patent No.: US 8,001,537 B1
(45) Date of Patent: Aug. 16, 2011

(54) METHOD AND APPARATUS FOR COMPILING PROGRAMMABLE LOGIC DEVICE CONFIGURATIONS

(75) Inventors: Mihail Iotov, San Jose, CA (US); David Neto, Toronto (CA); Pouyan Djahani, Toronto (CA); David Karchmer, Los Altos, CA (US); Kumara Tharmalingam, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 1222 days.

(21) Appl. No.: 11/294,702

(22) Filed: Dec. 5, 2005

(51) Int. Cl.
*G06F 9/45* (2006.01)
*G06F 17/50* (2006.01)
*G06F 9/455* (2006.01)

(52) U.S. Cl. ........ 717/140; 717/136; 716/103; 716/104; 716/107; 716/116

(58) Field of Classification Search .................. 717/121, 717/140, 136; 716/4, 12, 18, 15, 3, 104, 716/103, 107, 116
See application file for complete search history.

(56) References Cited

U.S. PATENT DOCUMENTS

| | | | | |
|---|---|---|---|---|
| 5,799,176 A * | 8/1998 | Kapusta et al. | ............... | 713/501 |
| 5,815,405 A * | 9/1998 | Baxter | ............................... | 716/3 |
| 6,078,735 A * | 6/2000 | Baxter | ............................... | 716/3 |
| 6,311,316 B1 * | 10/2001 | Huggins et al. | .................. | 716/12 |
| 6,324,672 B1 * | 11/2001 | Lawman et al. | ................... | 716/1 |
| 6,353,921 B1 * | 3/2002 | Law et al. | ......................... | 716/17 |
| 6,490,707 B1 * | 12/2002 | Baxter | ............................... | 716/2 |
| 6,539,341 B1 * | 3/2003 | Li et al. | .......................... | 702/187 |
| 6,625,787 B1 * | 9/2003 | Baxter et al. | ...................... | 716/6 |
| 6,836,842 B1 * | 12/2004 | Guccione et al. | .............. | 713/100 |
| 6,872,601 B1 * | 3/2005 | Baxter et al. | ..................... | 438/129 |
| 6,879,981 B2 * | 4/2005 | Rothschild et al. | .................... | 1/1 |
| 7,263,673 B1 * | 8/2007 | McElvain et al. | .................. | 716/3 |
| 7,275,232 B2 * | 9/2007 | Schleicher et al. | .............. | 716/16 |
| 7,328,195 B2 * | 2/2008 | Willis | ................................ | 706/14 |
| 7,368,940 B1 * | 5/2008 | Schultz | ............................ | 326/38 |
| 7,406,668 B1 * | 7/2008 | Pedersen et al. | ................... | 716/3 |
| 7,627,848 B2 * | 12/2009 | Madurawe | ....................... | 716/16 |
| 2004/0060032 A1 * | 3/2004 | McCubbrey | ...................... | 716/16 |
| 2004/0083441 A1 * | 4/2004 | Gweon et al. | ..................... | 716/12 |
| 2004/0186938 A1 * | 9/2004 | Imada et al. | ................... | 710/100 |
| 2005/0021572 A1 * | 1/2005 | Ren et al. | ....................... | 707/203 |
| 2007/0055963 A1 * | 3/2007 | Waddington et al. | ......... | 717/140 |

\* cited by examiner

*Primary Examiner* — Emerson C Puente
*Assistant Examiner* — Charles Swift
(74) *Attorney, Agent, or Firm* — Ropes & Gray LLP; Jeffrey H. Ingerman

(57) ABSTRACT

During compilation of a user logic design in a first type of programmable logic device (e.g., an FPGA), a log is kept of at least certain steps where choices are made. When that logic design is migrated to another type of programmable logic device (e.g., a mask-programmable logic device) the logged steps are taken into account to make sure that the same choices are made, so that the target device is functionally equivalent to the original device.

25 Claims, 7 Drawing Sheets

METHOD AND APPARATUS FOR COMPILING PROGRAMMABLE LOGIC DEVICE CONFIGURATIONS

BACKGROUND OF THE INVENTION

This invention relates to the compiling of programmable logic device (PLD) configurations. More particularly, this invention relates to such compilations for assuring functional equivalence between configurations of different types of PLDs.

Programmable logic devices are well-known. Early programmable logic devices were one-time configurable. For example, configuration may have been achieved by "blowing"—i.e., opening—fusible links. Alternatively, the configuration may have been stored in a programmable read-only memory. These devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration in a nonvolatile memory such as an EPROM, from which the configuration is loaded into the SRAM elements each time that the device is powered up. These conventional programmable logic devices, frequently referred to as "field-programmable gate arrays" (FPGAs), generally provide the user with the ability to configure the devices for look-up table-type logic operations. At some point, such devices began to be provided with embedded blocks of random access memory that could be configured by the user to act as random access memory, read-only memory, or logic (such as P-TERM logic).

In all of the foregoing programmable logic devices, both the logic functions of particular logic elements in the device, and the interconnect for routing of signals between the logic elements, were programmable. More recently, mask-programmable logic devices (MPLDs) have been provided. With mask-programmable logic devices, instead of selling all users the same device, the manufacturer manufactures a partial device with a standardized arrangement of logic elements whose functions are not programmable by the user, and which lacks any routing or interconnect resources.

The user provides the manufacturer of the mask-programmable logic device with the specifications of a desired device, which may be the configuration file for programming a comparable conventional programmable logic device (e.g., a comparable FPGA). More recently, software has become available that allows direct creation of a configuration file for the mask-programmable logic device. In any event, the manufacturer uses that information to add metallization layers to the partial device described above. Those additional layers program the logic elements by making certain connections within those elements, and also add interconnect routing between the logic elements. Mask-programmable logic devices can also be provided with embedded random access memory blocks, as described above in connection with conventional programmable logic devices. In such mask-programmable logic devices, if the embedded memory is configured as read-only memory or P-TERM logic, that configuration also is accomplished using the additional metallization layers.

Although with the simplest early programmable logic devices, it may have been possible to lay out a logic design by hand, it has been traditional to use software tools provided by the programmable logic device manufacturer or by third parties to program programmable logic devices. Contemporary programmable logic devices have become so complex that programming a device without such software tools is at best impractical.

The number of different programmable logic devices has proliferated. A single manufacturer might provide several different types of devices, and within a type several families of devices, and within a family several devices of different sizes having more or fewer features. A user may want to incorporate different programmable logic devices into different products or uses, but perform similar functions. Thus, a manufacturer of cellular telephones may provide telephone models of different prices and feature complexity. Among the components of such telephones may be programmed programmable logic devices. The telephone manufacturer's different models, having different prices, may incorporate different models of programmable logic devices that reflect the prices and features sets of the telephones. Nevertheless, for certain features, the telephone manufacturer may have proven certain programmable logic device programming and would like to use that programming in all of its telephones to the extent possible.

There may be other reasons why a user would want to use different versions of the same programming. For example, a user may have a working design for a particular programmable logic device, but may prototype additional features in a test program for the same programmable logic device. Once that test program has been proven, the user will want to migrate those features into the existing design. Or the user might want to optimize settings of the programming tool, without making any actual logical changes, to see if the programming tool can be made to provide a more efficient programming file.

Alternatively, a user may want to copy a design from a more complex programmable logic device into a smaller programmable logic device of the same family, to use, e.g., in a less expensive version of the same product. Or the user may want to migrate the design to a completely different programmable logic device family. For example, for cost reduction, the user may want to shift some of its production into mask-programmable devices. Certain mask-programmable devices are virtually identical to the conventional programmable logic devices to which they correspond, while others, such as that described in copending, commonly-assigned U.S. patent application Ser. No. 10/316,237, filed Dec. 9, 2002 and hereby incorporated herein by reference in its entirety, includes a plurality of more elementary logic areas that can be connected together to provide the functionality of a corresponding conventional programmable logic device. Either way, there will be differences (fewer or more, respectively) between the programming for a conventional programmable logic device and a corresponding mask-programmable logic device.

The user programming for each of these devices may be entered by the user in one or both of (a) a file, such as a hardware description language file, describing the logical behavior of the device, and (b) a file of settings for the programming tool. The combination of one or both of those files may be referred to as a "user configuration dataset." However, the actual programming of the devices is accomplished by compiling the user configuration dataset into a configuration file, which may be embodied as a bitstream or database reflecting a netlist of elements.

The aforementioned software tools allow a user to create programming for any type of programmable logic device, including both conventional (e.g., FPGA-type) programmable logic devices and mask-programmable logic devices. Once a particular user logic design has been successfully programmed, which includes compiling the user configuration dataset files into bitstream or database files, the user may want to migrate from the original device, and software is available to take a compiled configuration file for one type of device and convert it into a compiled configuration file for a different device.

However, it is not always possible to convert a compiled configuration because sometimes certain choices made in programming the source configuration may not be discernable from the final configuration file. Therefore, the software may come to a decision point where it cannot make a uniquely determined decision that will reproduce a completely compatible programmed device.

It would be desirable to be able, when migrating a user design from one type of programmable logic device to another, to have some assurance that migration will successfully reproduce a functionally equivalent device.

SUMMARY OF THE INVENTION

In accordance with the present invention, various decisions made during compilation of a user logic design for a programmable logic device are logged and stored with the configuration data for that programmable logic device. If and when that user logic design is migrated to a second type of programmable logic device, the logged decision data may be used to control the compilation of the second programmable logic device, so that the resulting programmed device is functionally equivalent. As part of the logging, consistency of name assignments for various components preferably is maintained as much as possible so that consistent results can be obtained.

For example, in some programmable logic devices, there may be multiple types of random-access memory (RAM) available, and it also may be possible to configure logic elements of the programmable logic device as RAM. If a user logic design calls for a certain amount of RAM, then depending on the balance of RAM requirements to other requirements, and the amount and types of RAM and logic available, the RAM called for by the user may be allocated in a certain way among the various types of RAM provided on the device and/or the logic elements of the device. If and when the user logic design is migrated to a different type of programmable logic device, then without the invention there would be no way to tell how or why the allocation of RAM came about, and therefore the allocation of RAM in the migrated design, given the physical constraints of the second device, may not match the intent of the original user design. According to the invention, the decisions that gave rise to the allocation of RAM in the first device would be available during compilation of the design in the second device, so that the allocation could be adjusted to achieve the user's objectives despite physical differences between the devices. If the compiled implementation includes more RAM blocks than the user specified because of how the RAM is allocated, the additional RAM blocks must be named by the software. In accordance with the invention, to maintain consistency across all compilations, a uniform naming system preferably assigns the names of the additional blocks.

Similarly, if in the original device two single-port elements share one dual-port RAM, when the user logic design is migrated to a different type of programmable logic device, then without the invention there would be no way to tell how or why those elements shared that RAM. Therefore, the compilation of the design in the second device may assign separate RAMs to the two single-port elements when in fact the user design derives some advantage from the sharing one dual-port RAM, or may force an assignment of a dual-port RAM to the two single-port elements when in fact it would be more efficient, because of other factors associated with the second device, to assign separate RAMs. According to the invention, the decisions that gave rise to the assignment of the dual-port RAM in the first device would be available during compilation of the design in the second device, so that the assignment could be adjusted to achieve the user's objectives despite physical differences between the devices. If the compiled implementation includes more RAM blocks than the user specified because of how the RAM is allocated among single-port and dual-port RAMs, the additional RAM blocks must be named by the software. In accordance with the invention, to maintain consistency across all compilations, a uniform naming system preferably assigns the names of the additional blocks.

As another example, the user logic design may include digital signal processing (DSP) blocks. The two different programmable logic devices in which the user design is to be implemented may be provided with hard DSP blocks, but in different amounts and locations. It may also be possible to implement DSP functions in logic instead of in the hard DSP blocks, depending on the needs of the design. The compilation of the user logic design for the first device may make a certain distribution or balance of hard DSP blocks and logic. Without the invention there would be no way to tell how or why the DSP blocks were distributed that way, and therefore the distribution of DSP blocks when the user logic design is compiled for the second programmable logic device may not be the optimal distribution. According to the invention, the decisions that gave rise to the distribution of DSP blocks in the first device would be available during compilation of the design in the second device, so that the distribution could be adjusted to achieve the user's objectives despite physical differences between the devices. If the compiled implementation includes more DSP blocks than the user specified because of how the DSP blocks are distributed, the additional DSP blocks must be named by the software. In accordance with the invention, to maintain consistency across all compilations, a uniform naming system preferably assigns the names of the additional blocks.

In another example, where in a user design a register in one logic element feeds logic (e.g., feeds a look-up table) in another logic element, that register may be moved inside the second logic element in the compiled design. This is known as "register packing," and may be performed because of spatial constraints, or to improve timing considerations (e.g., by reducing the propagation delay between the register and each LE). When migrating the design to a different programmable logic device, without the invention there is no way to tell from the compiled design itself that the register originated in a different logic element. In particular, sometimes such a register in one logic element feeds more than one other logic element, and for timing or other reasons the compiled design includes individual copies of the register packed into each target logic element. Without the invention, there is no way to tell from the compiled design that all of those registers originated as one register, or where the one register originated. According to the invention, that history would be available so that consistent assignments could be made in the second compilation. The consistent naming of the additional registers, as discussed above, is particularly important here and preferably is carried out by a uniform naming system in accordance with the invention.

Similar concerns arise with other allocations, such as phase-locked loop (PLL) type allocation where more than one type of PLL is available, and signal allocations (including clock signal allocations) among global and regional conductors.

Thus, in accordance with the present invention there is provided a method of compiling user configurations for different programmable logic devices. The method includes compiling a first user configuration for a first programmable logic device, during that compiling of that first configuration, recording a log of at least some steps of that compiling of that first configuration, compiling a second user configuration for a second programmable logic device, and consulting the log to control that compiling of that second configuration so that the second programmable logic device as configured by the second configuration is functionally equivalent to the first programmable logic device as configured by the first configuration. A programmable logic device programmed in accordance with the method is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

As described above, the present invention provides a way to migrate user logic designs among different programmable logic devices based on a proven compiled design, rather than having to convert uncompiled user configuration files and then recompile the design. According to the invention, a log is preferably kept during the first compilation to keep track of certain choices made during the first compilation that might not be apparent from an examination of the compiled configuration file. During compilation of the second, or target, device, the compilation procedure checks the log before compiling certain features where choices may have been made that would affect the compilation of those features.

In order for the logging and checking procedure to be effective, the affected features preferably should always be named the same way. This can be assured fairly reliable if programming is carried out using known software. However, some device vendors may provide the user with the ability to "patch" designs that need minor changes rather than completely recompile the design. Such patches may be referred to as "engineering change orders," and may allow a user to assign any desired name to a block. That ability may make it more difficult for the present invention to look up stored decisions in the log. However, reliability may be increased by encouraging users to use standard block names.

Various features that require decisions that could be made during the programming and compilation process, which might need to be logged according to the present invention, have been described above. However, there may be other features that require logging according to the present invention, and the aforementioned listed features should not be considered exclusive. However, the invention will now be described in detail, with reference to FIGS. 1-4, particularly in connection with the register packing feature described above. However, the choice of this feature to illustrate the present invention is exemplary only and should not be considered a limitation of the invention.

Figure 1:
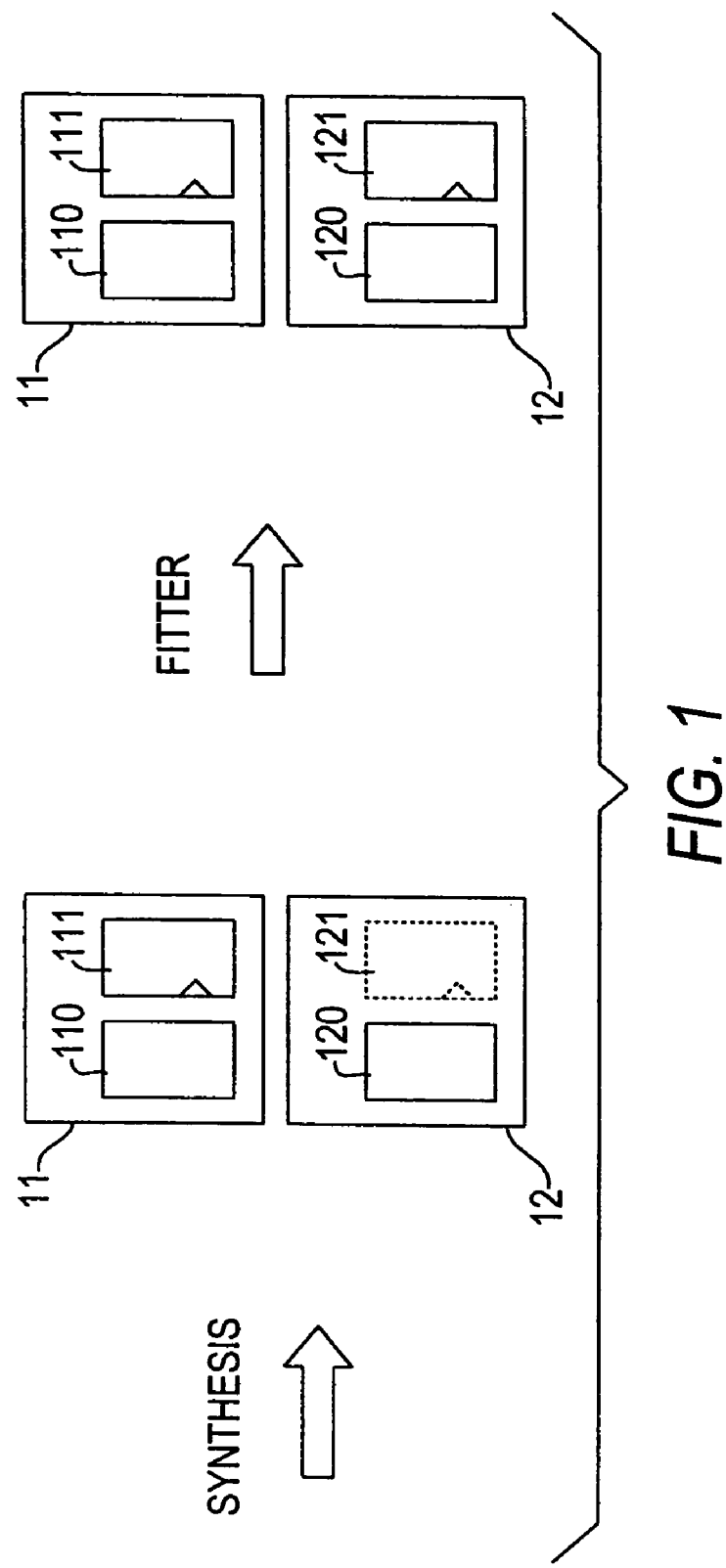
FIG. 1 is an illustration of an exemplary register packing problem solved by the present invention.

FIG. 1 shows a simple illustration of the problem solved by the invention. Each of logic elements (LEs) 11, 12 contains a look-up table (LUT) 110, 120 and a register 111, 121. As synthesized (on the left-hand side of FIG. 1), only register 111 is used by both LUTs 110, 120, while register 121 is not used. However, after fitting (on the right side of FIG. 1), only LUT 110 users register 111, while LUT 120 uses register 121. If no log is made at the time of packing (during fitting), it would be difficult to determine the correct correspondence of registers and LUTs when compiling the second device. But if a log is kept, then it is a straightforward matter to reproduce the correct relationships.

Figure 2:
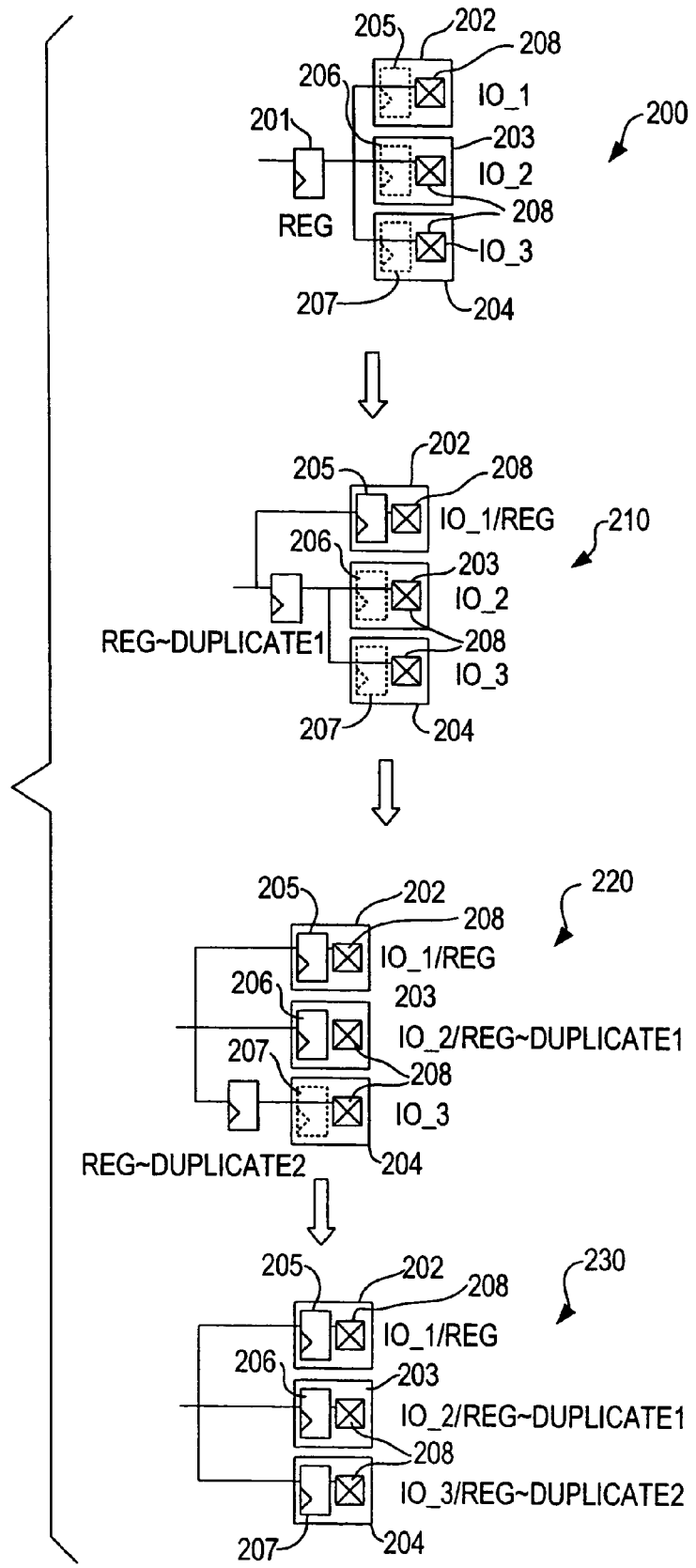
FIG. 2 is an illustration of an exemplary register packing problem solved by the present invention.
Figure 3:
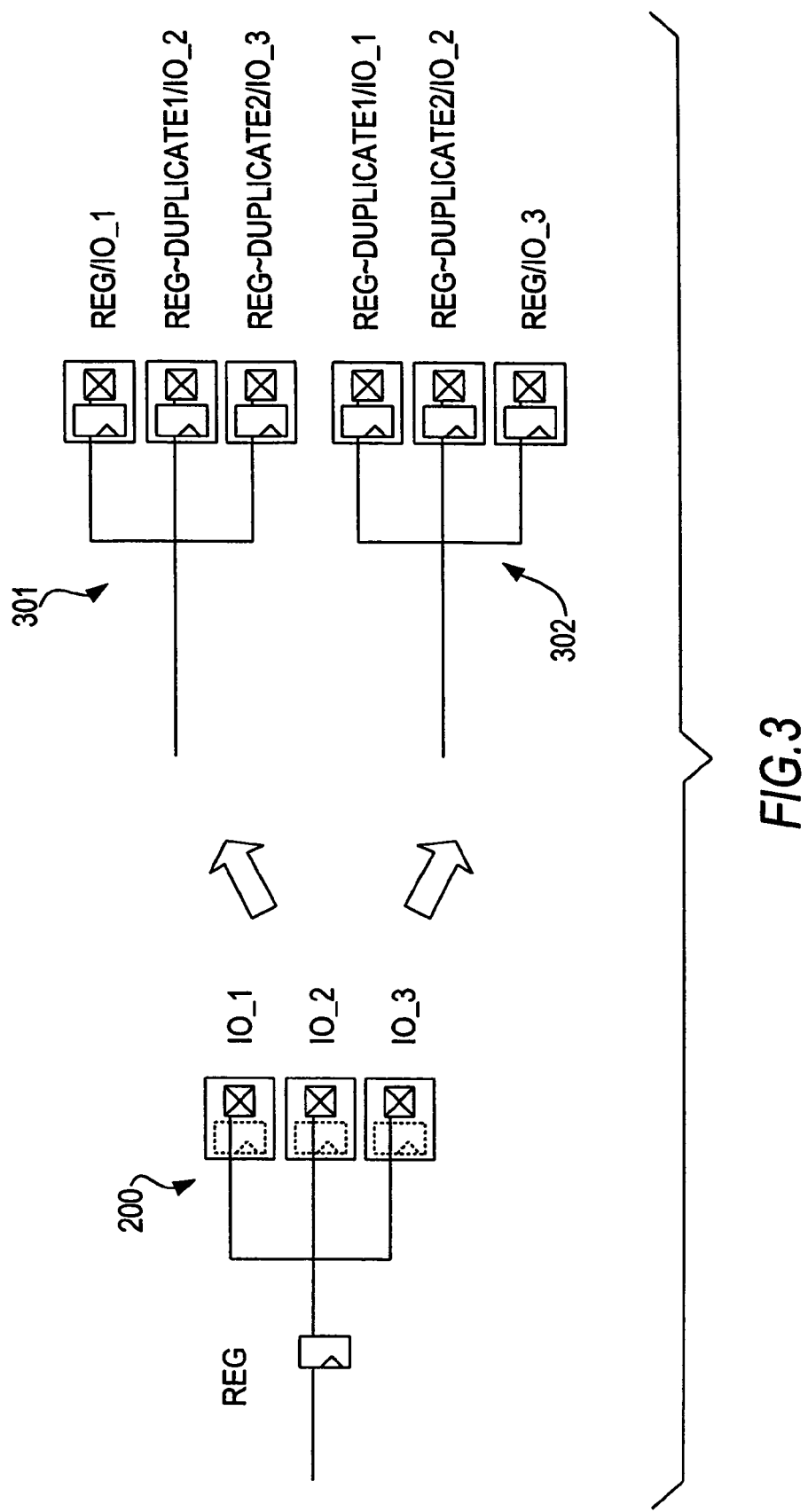
FIG. 3 is an illustration of a naming problem relevant to the present invention.

FIG. 2 shows a somewhat more complex example that illustrates the naming problem discussed above. At the top, arrangement 200 is based on the uncompiled user configuration file and shows a single register 201 shared by three LEs 202, 203, 204, each of which has a respective unused internal register 205, 206, 207 in addition to a respective LUT 208. At the bottom, the final arrangement 230 shows that register 201 has been packed into each of LEs 202, 203, 204 (using respective registers 205, 206, 207 in those LEs).

As depicted in FIG. 2, register 201 is identified as "reg" and LEs 202, 203, 204 are identified as IO_1, IO_2 and IO_3, respectively. If the packing operation is logged simply as "reg" being packed into IO_1, "reg" being packed into IO_2 and "reg" being packed into IO_3, confusion will result. Therefore, as seen in arrangement 230 the packed registers in IO_2 and IO_3 are identified as "reg~Duplicate1" and "reg~Duplicate2," respectively, and the packing operation is logged with those unique names so that the precise packing is reproducible.

Intermediate arrangements 210, 220 show how the duplicate register names may be derived. It is important that the same steps be followed uniformly to prevent the situation shown in FIG. 3 where the initial unpacked arrangement of FIG. 2 is shown being packed into two arrangements 301, 302. Arrangement 301 is identical to arrangement 230, while arrangement 302 also is identical to arrangement 230, except that is has a different set of register names. Preferably, the packing order is always the same so that the duplicate register names will always be the same.

Logging preferably occurs as the compilation process proceeds. Therefore, even if the compilation fails, the steps logged in accordance with the present invention may be present in the log. If the device is ultimately migrated, the steps logged during the failed compilation should not be used in the migration. However, there may be other reasons for maintaining them in the log, such as the ability to perform operations in the same order in later versions of the design tools. In accordance with the invention, there are several options for preventing the logged, failed steps from being used during a subsequent migration. First, copying of the logged steps from the logged database into the settings file used for migration can be prevented unless the user executes a migrate command with respect to the design to which the logged steps pertain. Second, copying of the logged steps from the logged database into the settings file used for migration can be prevented unless the compilation to which they pertain is successful. Third, the steps can be marked as not to be used. In addition, a report to the user may be generated, indicating that a certain step (e.g., a register packing) cannot not be migrated (e.g., because the register names do not match).

Figure 4:
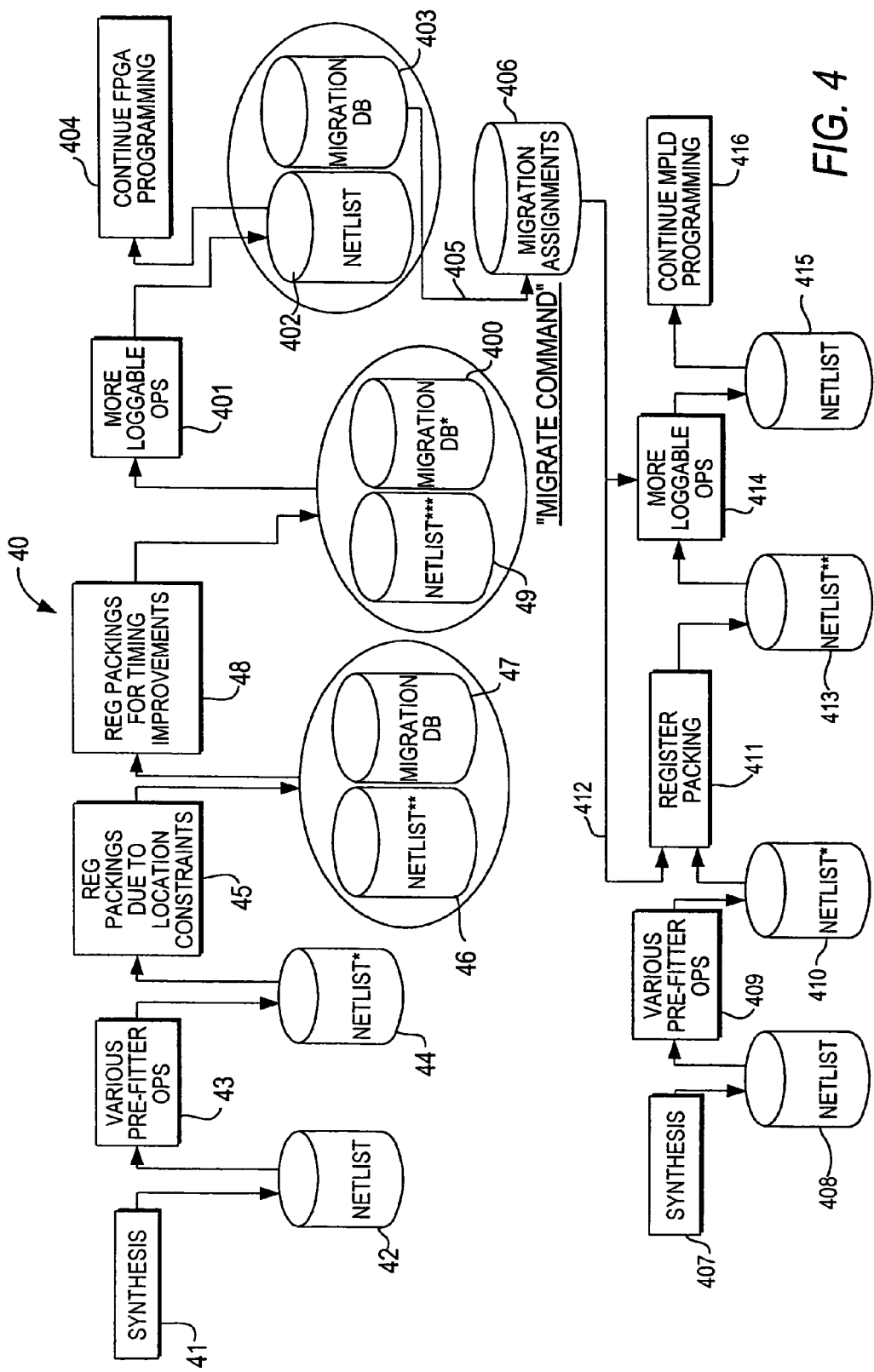
FIG. 4 is a flow diagram of a preferred embodiment of a method according to the present invention.

FIG. 4 is a diagram showing the flow of a preferred embodiment of a design creation and migration process 40 according to the invention. At step 41, a user design is synthesized for an FPGA, producing a netlist 42. At step 43, various pre-fitting operations—such as sweeping wires and constant nets, bit padding of buses, and merging of nets and blocks that can use the same resources—are performed on netlist 42, creating a revised netlist 44. At step 45, register packings to satisfy location constraints are performed. This step not only modifies netlist 44 to produce netlist 46, but also creates a log as described above in a separate migration file or database 47. At step 48, register packings to satisfy timing constraints are performed. This step not only modifies netlist 46 to produce netlist 49, but is also logged, adding to migration database 47 to create migration database 400. At step 401, additional loggable operations are performed, such as RAM, DSP or PLL allocation, further modifying netlist 49 to produce netlist 402, and adding to migration database 400 to create migration database 403. At 404, the process of FPGA programming continues, while at 405, preferably in response to a migration command by the user, migration database 403 is copied to a migration assignments file 406.

The migration process preferably begins with synthesis 407, producing netlist 408 for the target device, which may be, e.g., a mask-programmable logic device. At step 409, various pre-fitting operations, as described above in connection with step 43, are performed on netlist 408, creating a revised netlist 410. At step 411, register packings (preferably both to satisfy location constraints and to satisfy timing constraints) preferably are performed. In this step, as shown at 412, migration constraints from the logged file are taken into account, modifying netlist 410 to produce netlist 413. At step 414, additional operations that rely on the logged file are performed, such as RAM, DSP or PLL allocation, further modifying netlist 413 to produce netlist 415, which is used by the remainder of the programming process at 416.

Figure 5:
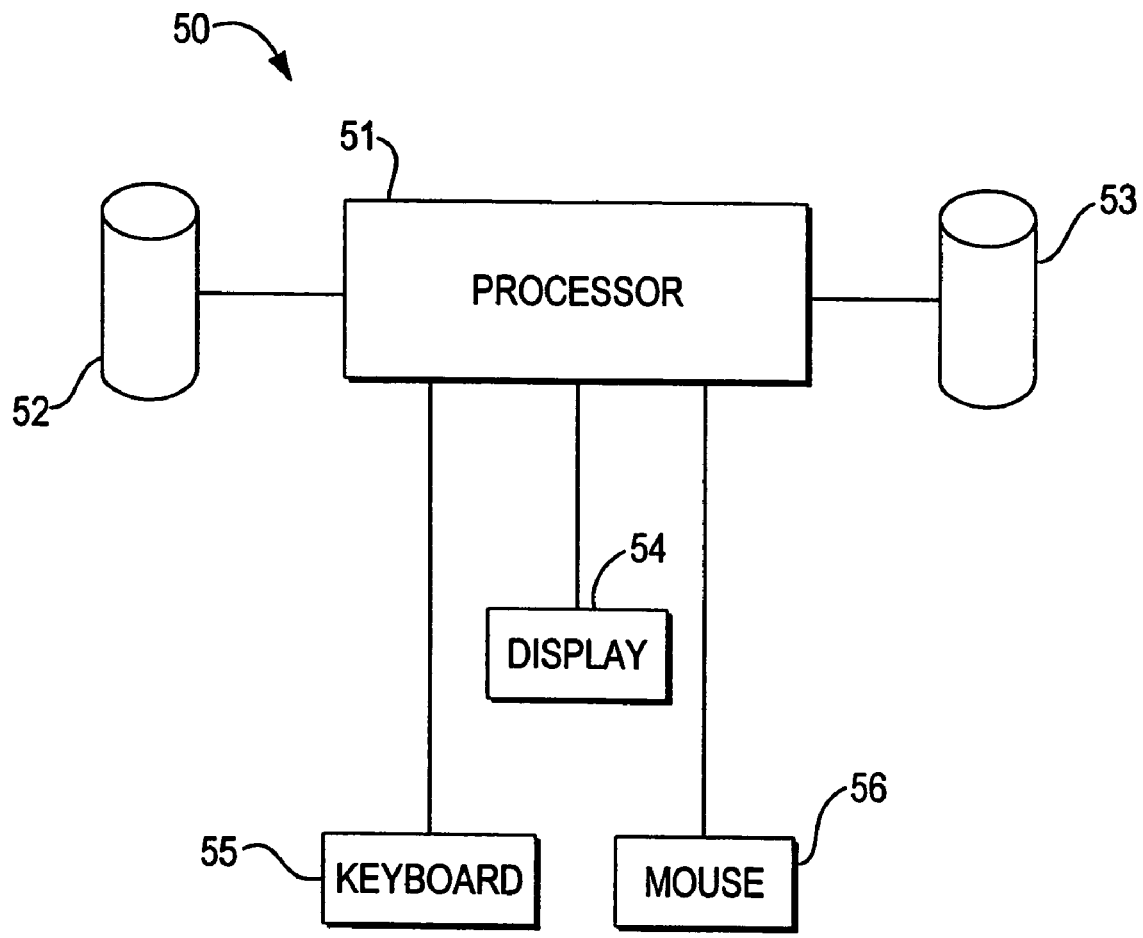
FIG. 5 is a schematic diagram of a preferred embodiment of apparatus according to the present invention for performing the method of FIG. 4.

FIG. 5 is a schematic diagram of apparatus 50 on which method 40 may be performed. Processor 51 preferably performs the synthesis and fitting steps referred to above, based on user inputs to keyboard 55 and mouse 56, reading and writing the netlist and log files to and from mass storage devices 52, 53, and displaying results on display 54.

Figure 6:
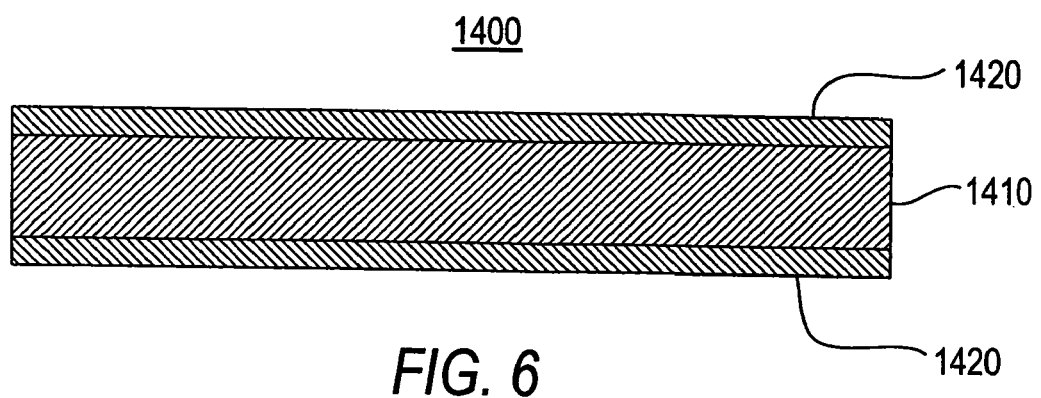
FIG. 6 is a cross-sectional view of a magnetic data storage medium encoded with a set of machine-executable instructions for performing the method according to the present invention.

FIG. 6 presents a cross section of a magnetic data storage medium 1400 which can be encoded with a machine executable program that can be carried out by systems such as system 50 of FIG. 5 to implement a method according to the invention such as method 40 of FIG. 4. Medium 1400 can be a floppy diskette or hard disk, having a suitable substrate 1410, which may be conventional, and a suitable coating 1420, which may be conventional, on one or both sides, containing magnetic domains (not visible) whose polarity or orientation can be altered magnetically. Medium 1400 may also have an opening (not shown) for receiving the spindle of a disk drive or other data storage device.

The magnetic domains of coating 1420 of medium 1400 are polarized or oriented so as to encode, in manner which may be conventional, a machine-executable program such as that described above in connection with FIG. 4, for execution by systems such as system 50 of FIG. 5.

Figure 7:
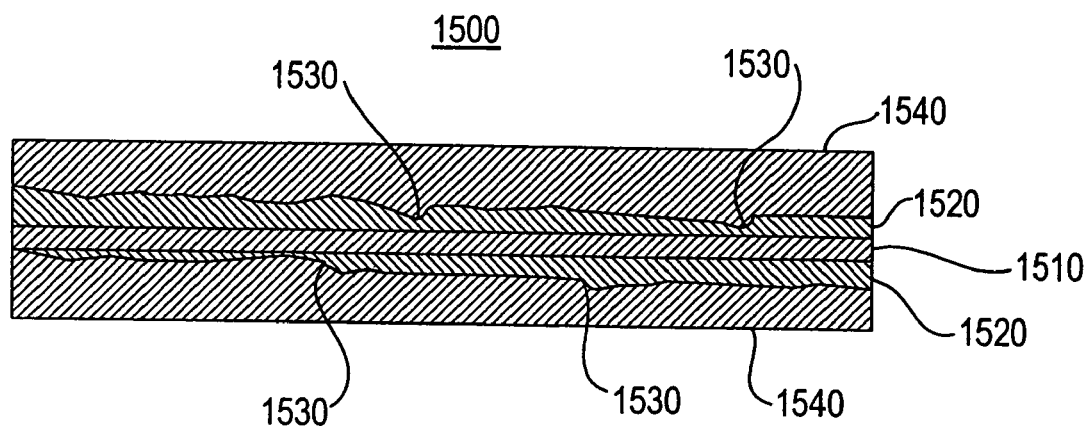
FIG. 7 is a cross-sectional view of an optically readable data storage medium encoded with a set of machine executable instructions for performing the method according to the present invention.

FIG. 7 shows a cross section of an optically-readable data storage medium 1500 which also can be encoded with such a machine-executable program, which can be carried out by systems such as system 50 of FIG. 5. Medium 1500 can be a conventional compact disk read only memory (CD-ROM) or digital video disk read only memory (DVD-ROM) or a rewriteable medium such as a CD-R, CD-RW, DVD-R, DVD-RW or DVD-RAM or a magneto-optical disk which is optically readable and magneto-optically rewriteable. Medium 1500 preferably has a suitable substrate 1510, which may be conventional, and a suitable coating 1520, which may be conventional, usually on one or both sides of substrate 1510.

In the case of a CD-based or DVD-based medium, as is well known, coating 1520 is reflective and is impressed with a plurality of pits 1530, arranged on one or more layers, to encode the machine-executable program. The arrangement of pits is read by reflecting laser light off the surface of coating 1520. A protective coating 1540, which preferably is substantially transparent, is provided on top of coating 1520.

In the case of magneto-optical disk, as is well known, coating 1520 has no pits 1530, but has a plurality of magnetic domains whose polarity or orientation can be changed magnetically when heated above a certain temperature, as by a laser (not shown). The orientation of each domain can be read by measuring the polarization of laser light reflected from coating 1520. The arrangement of the domains encodes the program as described above.

Figure 8:
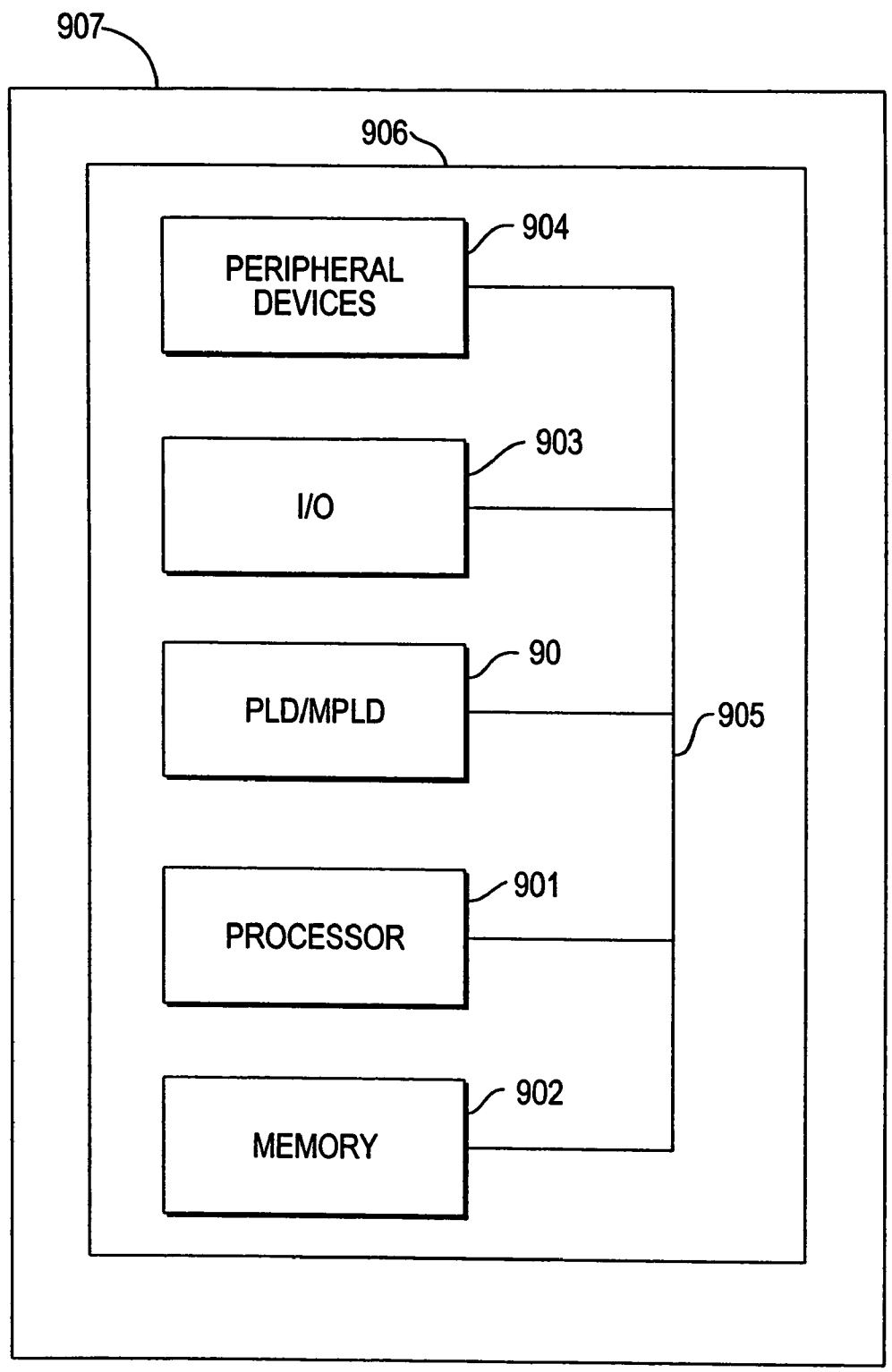
FIG. 8 is a simplified block diagram of an illustrative system employing a programmable logic device programmed in accordance with the present invention.

A PLD or MPLD 90 programmed according to the present invention may be used in many kinds of electronic devices. One possible use is in a data processing system 900 shown in FIG. 8. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD/MPLD 90 can be used to perform a variety of different logic functions. For example, PLD/MPLD 90 can be configured as a processor or controller that works in cooperation with processor 901. PLD/MPLD 90 may also be used as an arbiter for arbitrating access to a shared resources in system 900. In yet another example, PLD/MPLD 90 can be configured as an interface between processor 901 and one of the other components in system 900. It should be noted that system 900 is only exemplary, and that the true scope and spirit of the invention should be indicated by the following claims.

Various technologies can be used to implement PLDs/MPLDs 90 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A method of compiling user configurations for a plurality of programmable logic devices that differ from one another, said method comprising:
   compiling a first user configuration for a first one of said plurality of programmable logic devices;
   during said compiling of said first user configuration, recording, separately from said compiled first user configuration, a log of configuration choices, made during said compiling of said first user configuration, that cannot be discerned from said compiled first user configuration;
   compiling, from said compiled first user configuration, a second user configuration for a second one of said plurality of programmable logic devices that differs from said first one of said plurality of programmable logic devices; and
   consulting said log to control said compiling of said second user configuration from said compiled first user configuration so that said second one of said plurality of programmable logic devices as configured by said second user configuration is functionally equivalent to said first one of said plurality of programmable logic devices as configured by said first user configuration.

2. The method of claim 1 wherein said configuration choices comprise element names.

3. The method of claim 2 wherein said element names are assigned by said method.

4. The method of claim 1 wherein said configuration choices comprise block allocations.

5. The method of claim 4 wherein said block allocations are selected from the group consisting of RAM balancing, RAM sharing, PLL type allocation, DSP block balancing and register packing and retiming.

6. The method of claim 1 wherein said configuration choices comprise global conductor allocation.

7. The method of claim 6 wherein said global conductor allocation comprises global clock allocation.

8. The method of claim 1 further comprising updating said log based on results of said compiling of said first user configuration.

9. The method of claim 8 wherein said updating comprises deleting entries from said log on failure of said compiling of said first user configuration.

10. The method of claim 8 wherein said updating comprises marking entries in said log as unused on failure of said compiling of said first user configuration.

11. A programmable logic device programmed by a programming file that has been compared to another programming file in accordance with the method of claim 1.

12. A digital processing system comprising:
   processing circuitry;
   a memory coupled to said processing circuitry; and
   a programmable logic device as defined in claim 11 coupled to the processing circuitry and the memory.

13. A printed circuit board on which is mounted a programmable logic device as defined in claim 11.

14. The printed circuit board defined in claim 13 further comprising:
   memory circuitry mounted on the printed circuit board and coupled to the programmable logic device.

15. The printed circuit board defined in claim 14 further comprising:
   processing circuitry mounted on the printed circuit board and coupled to the memory circuitry.

16. A machine-readable data storage medium encoded with machine-executable instructions for performing a method of compiling user configurations for a plurality of programmable logic devices that differ from one another, said instructions comprising:
   instructions to compile a first user configuration for a first one of said plurality of programmable logic devices;
   instructions to record, during said compiling of said first user configuration, and separately from said compiled first user configuration, a log of configuration choices, made during said compiling of said first user configuration, that cannot be discerned from said compiled first user configuration;
   instructions to compile, from said compiled first user configuration, a second user configuration for a second one of said plurality of programmable logic devices that differs from said first one of said plurality of programmable logic devices; and
   instructions to consult said log to control said compiling of said second user configuration so that said second one of said plurality of programmable logic devices as configured by said second user configuration is functionally equivalent to said first one of said plurality of programmable logic devices as configured by said first user configuration.

17. The machine-readable data storage medium of claim 16 wherein said instructions to record said configuration choices comprise instructions to record element names.

18. The machine-readable data storage medium of claim 17 wherein said instructions to record said element names comprise instructions to record element names assigned by said method.

19. The machine-readable data storage medium of claim 16 wherein said instructions to record said configuration choices comprise instructions to record block allocations.

20. The machine-readable data storage medium of claim 19 wherein said instructions to record said block allocations comprise instructions to record block allocations selected from the group consisting of RAM balancing, RAM sharing, PLL type allocation, DSP block balancing and register packing and retiming.

21. The machine-readable data storage medium of claim 16 wherein said instructions to record said configuration choices comprise instructions to record global conductor allocation.

22. The machine-readable data storage medium of claim 21 wherein said instructions to record said global conductor allocation comprises instructions to record global clock allocation.

23. The machine-readable data storage medium of claim 16 wherein said instructions further comprise instructions to update said log based on results of said compiling of said first user configuration.

24. The machine-readable data storage medium of claim 23 wherein said instructions to update said log comprise instructions to delete entries from said log on failure of said compiling of said first user configuration.

25. The machine-readable data storage medium of claim 23 wherein said instructions to update said log comprise instructions to mark entries in said log as unused on failure of said compiling of said first user configuration.

* * * * *